United States Patent [19]
Chiba et al.

[11] Patent Number: 5,999,589
[45] Date of Patent: Dec. 7, 1999

[54] SUBSTRATE HOLDING DEVICE AND EXPOSING APPARATUS USING THE SAME

[75] Inventors: Yuji Chiba, Isehara; Nobutoshi Mizusawa, Yamato; Kazunori Iwamoto, Yokohama; Yutaka Tanaka, Yokohama; Shinichi Hara, Yokohama; Mitsuji Marumo, Sagamihara; Shin Matsui, Atsugi; Hiroshi Kurosawa, Tokyo, all of Japan

[73] Assignee: Canon Kabushiki Kaisha, Tokyo, Japan

[21] Appl. No.: 09/140,679

[22] Filed: Aug. 26, 1998

Related U.S. Application Data

[62] Division of application No. 08/464,225, Jun. 5, 1995, Pat. No. 5,883,932, which is a continuation of application No. 08/124,472, Sep. 22, 1993, abandoned.

[30] Foreign Application Priority Data

| Sep. 25, 1992 | [JP] | Japan | 4-281016 |
| Jul. 6, 1993 | [JP] | Japan | 5-191893 |
| Aug. 25, 1993 | [JP] | Japan | 5-232375 |

[51] Int. Cl.$^6$ ................................ H01J 37/20
[52] U.S. Cl. ............................. 378/34; 378/208
[58] Field of Search .................... 378/34, 208, 209; 269/21; 250/491.1

[56] References Cited

U.S. PATENT DOCUMENTS

| 4,522,489 | 6/1985 | Bouwer | 355/73 |
| 4,869,481 | 9/1989 | Yabu et al. | 269/21 |
| 4,999,506 | 3/1991 | Mizusawa et al. | 250/491.1 |
| 5,160,961 | 11/1992 | Marumo et al. | 355/53 |
| 5,161,177 | 11/1992 | Chiba | 378/34 |
| 5,164,974 | 11/1992 | Kariya et al. | 378/34 |
| 5,191,218 | 3/1993 | Mori et al. | 250/453.11 |
| 5,197,089 | 3/1993 | Baker | 378/34 |
| 5,203,547 | 4/1993 | Marumo | 269/21 |
| 5,231,291 | 7/1993 | Amemiya et al. | 250/443.1 |
| 5,253,012 | 10/1993 | Chiba et al. | 355/53 |
| 5,374,829 | 12/1994 | Sakamoto et al. | 279/3 |
| 5,524,131 | 6/1996 | Uzawa et al. | 378/34 |
| 5,640,440 | 6/1997 | Kuno et al. | 378/208 |
| 5,883,932 | 3/1999 | Chiba et al. | 378/34 |

FOREIGN PATENT DOCUMENTS

| 1-0214042 | 8/1989 | Japan . |
| 2-202031 | 8/1990 | Japan . |

*Primary Examiner*—David P. Porta
*Attorney, Agent, or Firm*—Fitzpatrick, Cella, Harper & Scinto

[57] ABSTRACT

A substrate holding device includes a vacuum supplying device for supplying a vacuum to a holding surface to hold a substrate, a hollow member surrounding at least a portion of the holding surface and movable between a position in which the holding member protrudes from the holding surface and a position in which the hollow member does not protrude from the holding surface, and a moving mechanism for relatively moving between the hollow member and the holding surface.

16 Claims, 20 Drawing Sheets

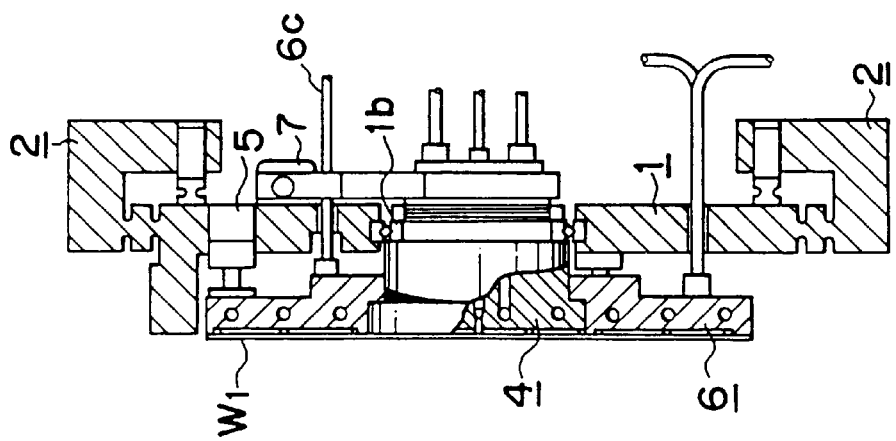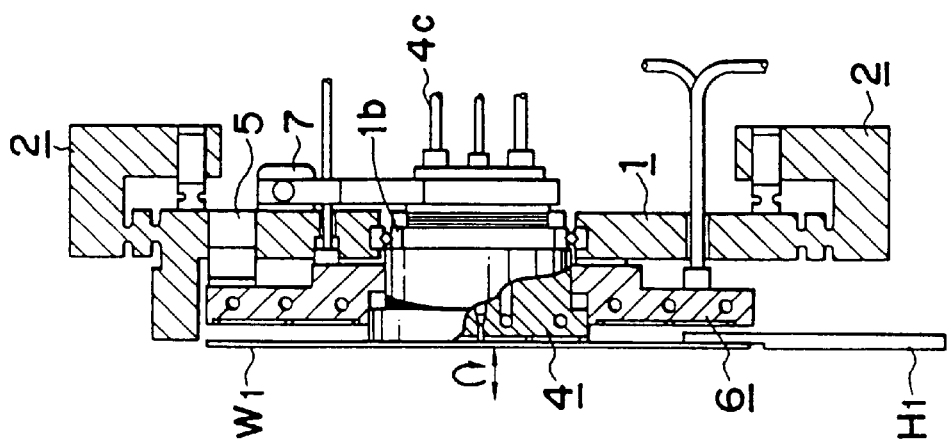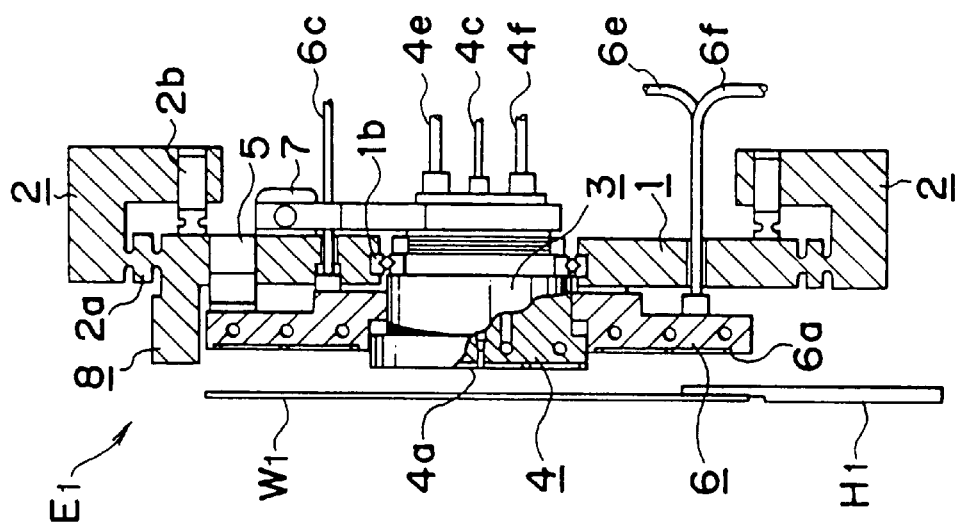

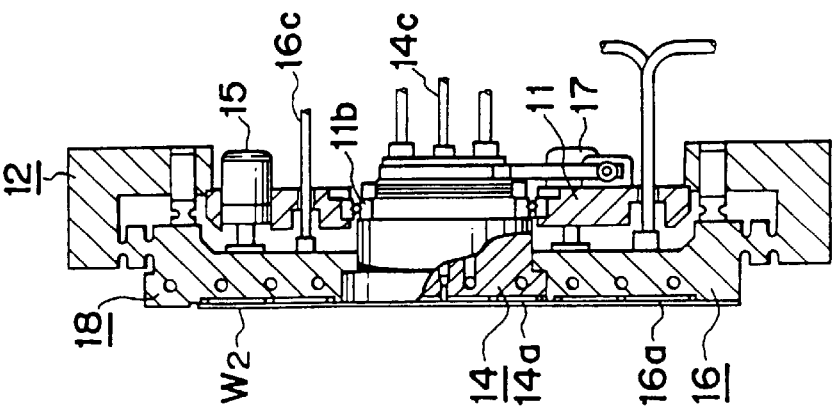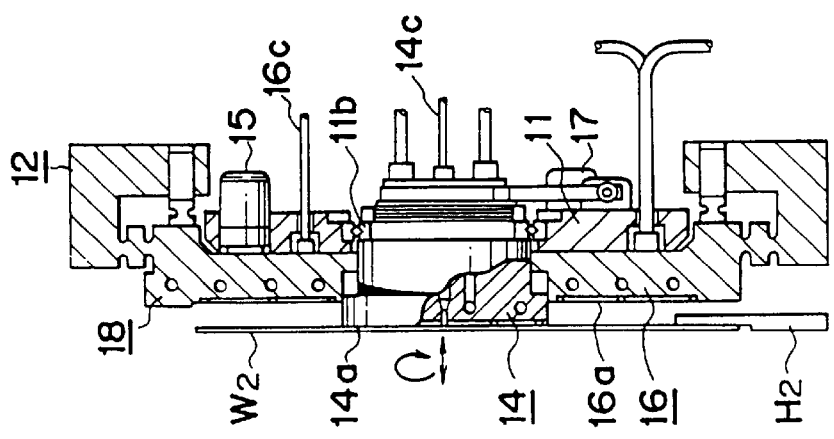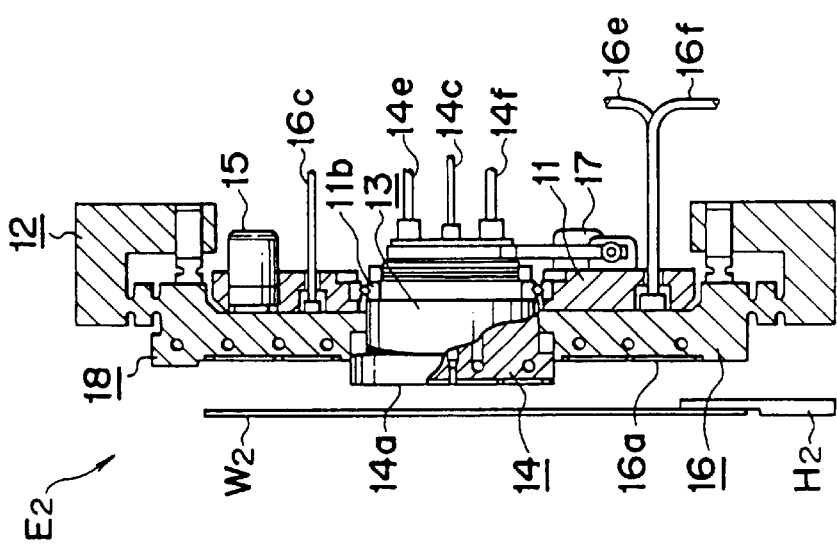

SUBSTRATE HOLDING DEVICE AND EXPOSING APPARATUS USING THE SAME

This application is a divisional of application Ser. No. 08/464,225, filed Jun. 5, 1995 now U.S. Pat. No. 5,885,932 which is a continuation of Ser. No. 08/124,432 filed Sep. 22, 1993, now abandoned.

BACKGROUND OF THE INVENTION

1. Field of the Invention

This present invention relates to a substrate holding device in an exposing apparatus for exposing a substrate such as a wafer and an exposing apparatus using the same.

2. Related Background Art

The higher integration of semiconductor integrated circuits has been advanced more and more in recent years, and higher accuracy has been required of an exposing apparatus for making them.

Accordingly, highly accurate positioning is also required of a substrate such as a wafer to be exposed (hereinafter referred to as the "substrate"), and as an example, like the six-axis drive substrate stage described in Japanese Laid-Open Patent Application No. 2-202031, there has been developed a substrate stage of which the movement is adjustable to any position by reciprocal movement along three axes orthogonal to one another and the angles of rotation about respective ones of said three axes are adjustable. A conventional substrate holding device supported on such a substrate stage, as shown in FIGS. 20 and 21 of the accompanying drawings, has a disc-like vacuum clamping plate 106 formed with a groove 106b in the surface thereof for vacuum clamping a substrate (not shown), the vacuum clamping plate 106 being formed with a plurality of holes 106g–106i extending in a direction perpendicular to the surface thereof (hereinafter referred to as the "Z axis direction"), and hollow delivering pins 104a–104c are inserted into the respective holes 106g–106i. The delivering pins 104a–104c are studded in an intermediate plate 103 disposed just beneath the vacuum clamping plate 106, and the intermediate plate 103 supports a plurality of double acting cylinders 105 for moving the vacuum clamping plate 106 back and forth in the Z axis direction.

Also, the intermediate plate 103 is rotatably supported on a base plate 101 by bearings 101a, and is rotated by a drive motor 107 through a worm gear 107a. The base plate 101 has on the upper surface thereof an L-shaped mirror 108 provided integrally therewith, the mirror 108 has mirror surfaces 108a and 108b parallel to two axes orthogonal to each other (hereinafter referred to as the "X axis and Y axis"), and reflects a length measuring laser beam applied to the mirror surfaces 108a and 108b toward a laser interference length measuring machine, not shown. The base plate 101 is formed integrally with a bed plate 102 through resilient hinges 102a, and is reciprocally movable in the Z axis direction or rotatable about the Z axis by an actuator 102b such as an electrostrictive element or a voice coil for fine movement adjustment within a range allowed by the resilient hinges 102a. The bed plate 102 is supported on a conventional six-axis drive substrate stage (not shown).

The delivery and positioning of the substrate (not shown) are effected as follows.

With the double acting cylinders 105 driven to retract the vacuum clamping plate 106, a vacuum clamp force is created in the delivering pins 104a–104c by a vacuum line 104d, and a substrate carried in by a hand (not shown) is adsorbed on the upper ends of the delivering pins 104a–104c. The double acting cylinders 105 are then reversely driven to move the vacuum clamping plate 106 forward, and a vacuum clamp force is created in the groove 106b of the vacuum clamping plate 106 by a vacuum line 106c to thereby adsorb the substrate to the vacuum clamping surface 106a of the sucking plate 106. Thereby, the substrate is firmly held and the flatness thereof is corrected. Further, the positional deviation of the substrate about the Z axis relative to a mask or the like is detected by an alignment scope or the like, not shown, and the motor 107 is driven to rotate the vacuum clamping plate 106, thereby eliminating the aforementioned positional deviation.

An exposing apparatus using a radiation beam of a shorter wavelength has recently been developed, and particularly in an exposing apparatus using charged particle accumulation ring radiation (hereinafter referred to as an "SR-X-ray") as a radiation beam, it is necessary that the substrate in an exposure chamber be held vertically and the exposure chamber be maintained in a reduced pressure atmosphere to prevent the attenuation of the SR-X-ray.

The above-described conventional substrate holding device, however, cannot be used in the exposing apparatus using the SR-X-ray as a radiation beam. The reasons are as follows:

(1) The vacuum clamp force alone created at the upper ends of the delivering pins is insufficient as the vacuum clamp force for effecting the delivery and holding of the vertically held substrate in the pressure-reduced exposure chamber.

(2) In the pressure-reduced exposure chamber, the heat transfer from the substrate to the subatmosphere is small as compared with the atmospheric pressure condition and therefore, the temperature rise of the substrate holding device is remarkable. As a result, positional deviation occurs from the distortion created by the difference in thermal expansion between the base plate and the vacuum clamping plate, and the position of the reflecting surface of the mirror for reflecting the length measuring laser beam fluctuates and a great error occurs to the measurement of the position of the substrate holding device by the laser length measuring machine.

In addition, recently, the substrate is in a tendency toward a larger size and along therewith, a vacuum clamping plate of a large area is required, but a larger size of a mechanism for rotating it is not desirable.

Also, the substrate holding device receives the substrate carried in by the hand and effects the predetermined positioning of it, adsorbs the substrate to the vacuum clamping surface of the vacuum clamping plate and corrects the degree of planarity thereof, and in order that such a correction of the degree of planarity may be effectively effected, the sizes and numbers of the grooves and holes formed in the vacuum clamping surface of the substrate may desirably be small.

Further, to circulate temperature control fluid through the internal piping of the substrate holding device to thereby effectively adjust the temperature of the substrate, it is desirable that the numbers and sizes of grooves and holes for reducing the area of contact between the substrate and the vacuum clamping surface be small. However, if the delivering pins for receiving the substrate carried in by the hand are made too thin or too much reduced in number, a sufficient vacuum clamp force for the delivery of the substrate cannot be created and there will arise a difficulty such as the substrate being inclined during the delivery work or great positional deviation being caused.

SUMMARY OF THE INVENTION

The present invention has been made in view of the above-noted unsolved problems peculiar to the prior art and an object thereof is to provide a substrate holding device in which a vacuum clamp force for effecting the delivery of a substrate can be greatly increased and moreover a mechanism for vacuum clamping and rotating the substrate can be made compact, and an exposing apparatus using the same.

Another object of the present invention is to provide a substrate holding device in which a vacuum clamp force for the delivery of a substrate can be greatly increased without the area of contact between the substrate and a vacuum clamping plate being remarkably decreased, and an exposing apparatus using the same.

A further object of the present invention is to provide a substrate holding device having no possibility of dropping a substrate being delivered when the delivery of the substrate is effected in a pressure-reduced chamber or even when a vacuum clamping surface is vertical.

Further objects of the present invention will become apparent from the following detailed description of some embodiments of the invention.

To achieve the above objects, the substrate holding device of the present invention is characterized by first and second vacuum clamping plates for vacuum clamping a portion of a substrate, first driving means for rotating said first vacuum clamping plate relative to said second vacuum clamping plate, and second driving means for reciprocally moving said first vacuum clamping plate between a position in which it protrudes by a predetermined amount from the vacuum clamping surface of said second vacuum clamping plate and a position in which it does not protrude from said vacuum clamping surface. It is preferable that a mirror for reflecting a length measuring laser beam be provided integrally with the second vacuum clamping plate.

Another form of the substrate holding device of the present invention is characterized by a vacuum clamping plate creating a vacuum clamp force on the holding surface thereof, a cylindrical delivering member reciprocally movable between a position in which it surrounds at least a portion of said holding surface and protrudes by a predetermined amount from said holding surface and a position in which it does not protrude from said holding surface, and driving means for moving said delivering member. It is preferable that the delivering member be rotatable.

A substrate is received from a conveying hand with the first vacuum clamping plate protruded, a portion of said substrate is adsorbed, and the first vacuum clamping plate is rotated by the first driving means to thereby eliminate any positional deviation of the substrate, whereafter the first vacuum clamping plate is retracted by the second driving means to the position in which it does not protrude from the second vacuum clamping plate.

If the substrate holding device has the vacuum clamping plate creating a vacuum clamp force on the holding surface thereof, the cylindrical delivery member reciprocally movable between the position in which it surrounds at least a portion of said holding surface and protrudes by a predetermined amount from said holding surface and the position in which it does not protrude from said holding surface, and the driving means for moving the delivering member, a substrate is received from the conveying hand with the delivering member protruded by a predetermined amount from the holding surface of the vacuum clamping plate, and the substrate is adsorbed to the delivering member by a vacuum clamp force created on at least a portion of the holding surface. The conveying hand is retracted, whereafter the delivering member is retracted to the position in which it does not protrude from the holding surface, and the substrate is adsorbed to the holding surface. If a great vacuum clamp is necessary for the delivery of the substrate, that portion of the holding surface which is surrounded by the delivering member can be widened.

If the delivering member is rotatable, the delivering member can be rotated to thereby eliminate any positional deviation of the substrate before the substrate is adsorbed to the holding surface.

BRIEF DESCRIPTION OF THE DRAWINGS

FIGS. 3A to 3C illustrate the operation of the substrate holding device according to the first embodiment, FIG. 3A being a schematic cross-sectional view showing the state immediately before a substrate is received, FIG. 3B being a schematic cross-sectional view showing a state in which a first vacuum clamping plate adsorbs the substrate thereto, and FIG. 3C being a schematic cross-sectional view showing a state in which first and second vacuum clamping plates adsorb the substrate thereto.

FIGS. 6A to 6C illustrate the operation of the substrate holding device according to the second embodiment, FIG. 6A being a schematic cross-sectional view showing the state immediately before a substrate is received, FIG. 6B being a schematic cross-sectional view showing a state in which a first vacuum clamping plate adsorbs the substrate thereto, and FIG. 6C being a schematic cross-sectional view showing a state in which first and second vacuum clamping plates adsorb the substrate thereto.

DETAILED DESCRIPTION OF THE PREFERRED EMBODIMENTS

Some embodiments of the present invention will hereinafter be described with reference to the drawings.

Figure 1:
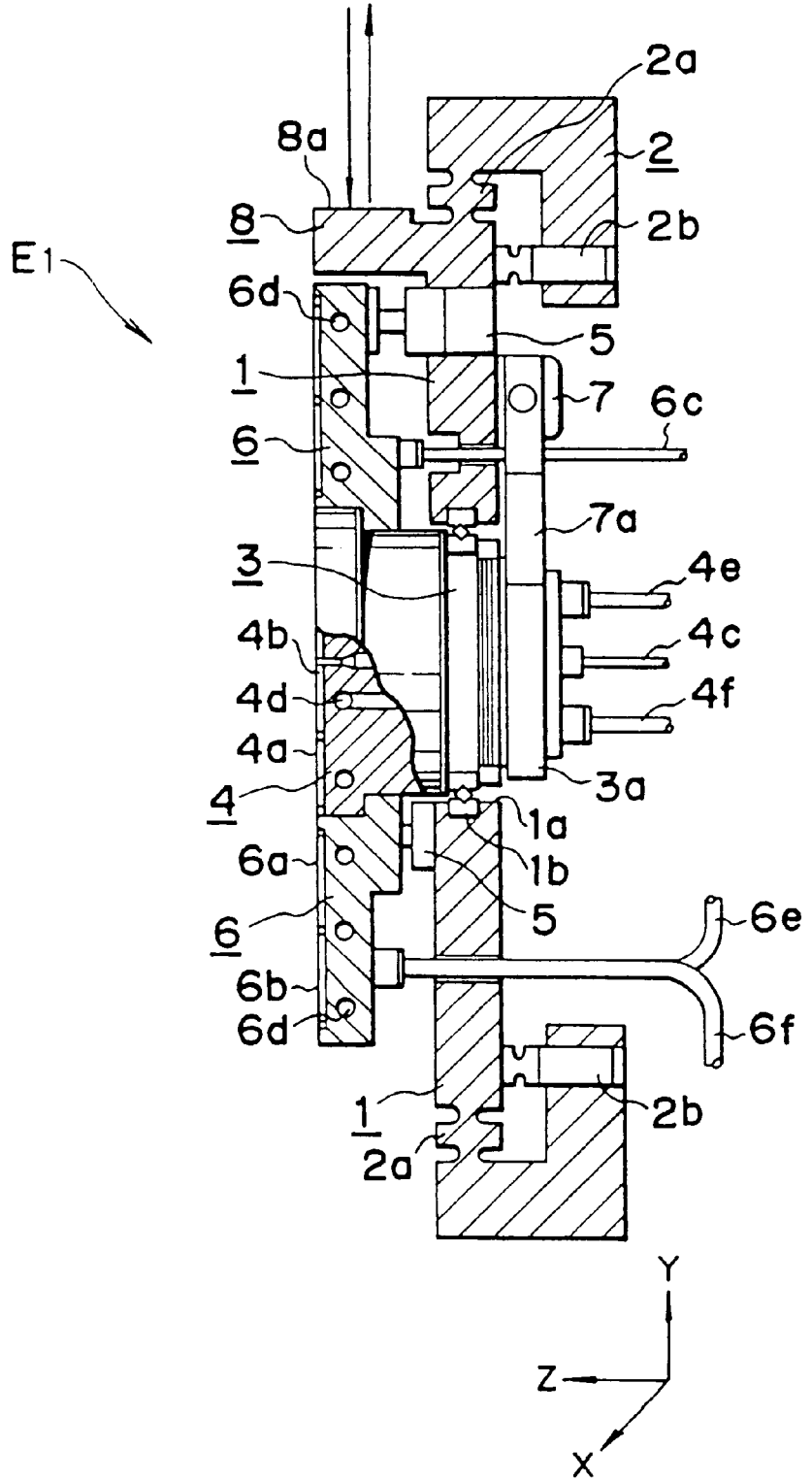
FIG. 1 is a schematic cross-sectional view showing a substrate holding device according to a first embodiment of the present invention.
Figure 2:
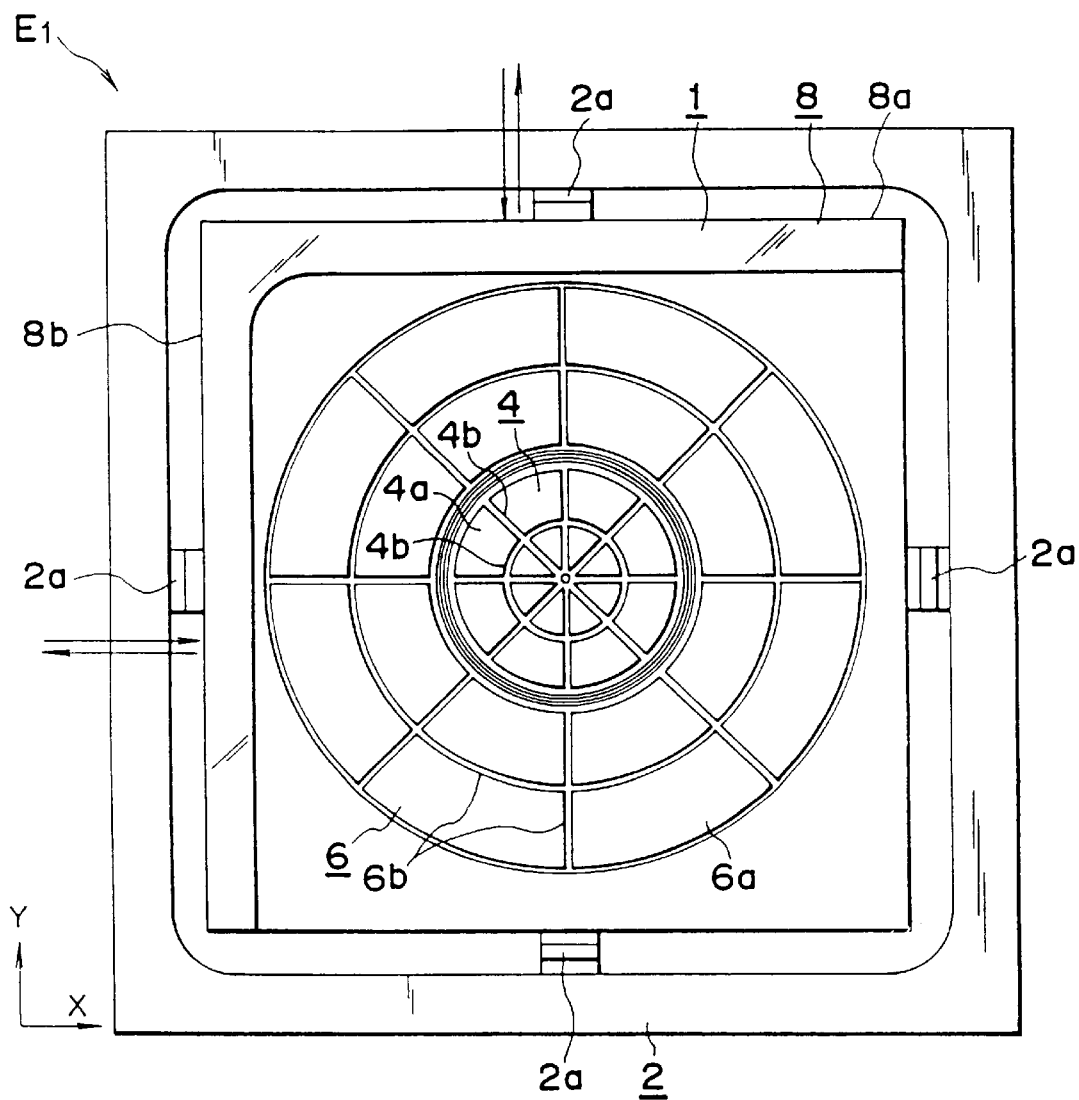
FIG. 2 is a schematic plan view of the substrate holding device according to the first embodiment.

FIG. 1 is a schematic cross-sectional view showing a first embodiment of the present invention, and FIG. 2 is a schematic plan view thereof. The substrate holding device E1 of the present embodiment comprises a base plate 1 which is plate-like supporting means for holding a bearing 1b such as a cross roller bearing in the central opening 1a thereof, a bed plate 2 which is a square frame-like substrate stage integrally coupled to the base plate 1 through four resilient hinges 2a, a rotor 3 rotatably supported on the base plate 1 by the bearing 1b, a first vacuum clamping plate 4 having a disc-like sucking plate 4a provided integrally with the rotor 3, and a second vacuum clamping plate 6 supported on the base plate 1 through a plurality of double acting cylinders 5 which are second driving means disposed at predetermined intervals circumferentially thereof, the second vacuum clamping plate 6 having an annular vacuum clamping surface 6a disposed concentrically with the vacuum clamping surface 4a of the first vacuum clamping plate 4.

The bed plate 2 is supported by a six-axis driving table mechanism, not shown, and a plurality of actuators 2b such as electrostrictive elements or voice coils for fine movement adjustment are disposed between the base plate 1 and the bed plate 2, each of the actuators 2b moving the base plate 1 toward and away from the bed plate 2 within a range permitted by the resilient hinges 2a, or inclining the base plate 1 in any direction. An actuator which is first driving means for rotating the rotor 3 and the first vacuum clamping plate 4 provided integrally with the rotor 3 is provided with a DC servo motor 7 supported on the base plate 1, and is designed to transmit the rotative drive force thereof to the lower half 3a of the rotor 3 through a direct acting conversion mechanism, not shown, and a hinge arm 7a.

The double acting cylinders 5 reciprocally move the second vacuum clamping plate 6 in a direction perpendicular to the surface of the base plate 1 (hereinafter referred to as the "Z axis direction"). An L-shaped mirror 8 having a pair of reflecting surfaces 8a and 8b orthogonal to each other is provided integrally with the outer peripheral edge of the base plate 1, and the reflecting surfaces 8a and 8b reflect a length measuring laser beam toward a laser interference length measuring machine (not shown).

The laser interference length measuring machine detects any positional deviation of the base plate 1 along two axes perpendicular to the Z axis and orthogonal to each other (hereinafter referred to as the "X axis and Y axis") by the reflected light from the mirror 8, and drives the aforementioned six-axis driving table mechanism on the basis of the detected positional deviation.

Radially and annularly extending grooves 4b and 6b are formed in the respective vacuum clamping surfaces 4a and 6a of the first and second vacuum clamping plates 4 and 6, and the grooves 4b and 6b are connected to first and second vacuum lines 4c and 6c, respectively, via internal piping not shown. Liquid flow paths 4d and 6d for circulating cooling, constant-temperature water are provided in the first and second vacuum clamping plates 4 and 6, respectively, and the water supply ends (not shown) thereof are connected to first and second water supply pipes 4e and 6e, respectively, and the water discharge ends (not shown) thereof are connected to first and second water discharge pipes 4f and 6f, respectively, constituting first and second water supply and discharge means together with the water supply pipes 4e and 6e.

The delivery of a substrate is effected as shown in FIGS. 3A to 3C.

As shown in FIG. 3A, the second vacuum clamping plate 6 is first moved in the Z axis direction by the driving of the double acting cylinders 5 to thereby retract the vacuum clamping surface 6a thereof by about 6 mm from the vacuum clamping surface 4a of the first vacuum clamping plate 4, whereafter by a hand H1, a substrate W1 is conveyed to a position 5 adjacent to the substrate holding device E1.

Then, as shown in FIG. 3B, the substrate W1 is brought close to the vacuum clamping surface 4a of the first vacuum clamping plate 4, and the valve (not shown) of the first vacuum line 4c is opened to thereby adsorb the central portion of the substrate W1 to the vacuum clamping surface 4a of the first vacuum clamping plate 4. In this state, the substrate holding device E1 is moved to a prealignment station, and any positional deviation of the substrate W1 about the Z axis and any positional deviation of the substrate W1 along the X axis and Y axis are detected by a conventional prealignment scope. The positional deviation about the Z axis is eliminated by the DC servo motor 7 being driven to rotate the first vacuum clamping plate 4 with the rotor 3, and the positional deviation along the X axis and Y axis is eliminated by controlling the six-axis driving table mechanism when the substrate holding device E1 is returned from the prealignment station to the original position.

Subsequently, by the reverse driving of the double acting cylinders 5, the second vacuum clamping plate 6 is moved toward the substrate W1, and as shown in FIG. 3C, the vacuum clamping surface 6a thereof is brought close to the back of the outer peripheral portion of the substrate W1 and also, the valve (not shown) of the second vacuum line 6c is opened to thereby vacuum clamp the substrate W1 to the vacuum clamping surface 6a of the second vacuum clamping plate 6. The first and second vacuum clamping plates 4 and 6 are cooled by constant-temperature water flowing through the liquid flow paths 4d and 6d, and the substrate W1 may be distorted by the temperature difference between the substrate W1 and the vacuum clamping plate 4 when the substrate W1 is vacuum clamped to the first vacuum clamping plate 4. In order to avoid this, it is desirable that after the substrate W1 is adsorbed to the first vacuum clamping plate 4, the vacuum clamp force by the first vacuum line 4c be intermittently released without the vacuum clamping force of the hand H1 being released, and the delivering operation be repeated several times to thereby gradually eliminate the temperature difference and prevent the substrate W1 from being distorted.

It is also desirable that in order to reduce the vibration caused by the flowing of the constant temperature water during the exposure of the substrate W1, when the exposure area is on the vacuum clamping surface 4a of the first vacuum clamping plate 4, the water supply by the second water supply pipe 6e be interrupted, and when the exposure area is on the vacuum clamping surface 6a of the second vacuum clamping plate 6, the water supply by the first water supply pipe 4e be interrupted. According to the present embodiment, a vacuum clamp force sufficient for the delivery of the substrate vertically held in a pressure-reduced chamber can be secured by the vacuum clamping surface of the first vacuum clamping plate.

Also, the first vacuum clamping plate alone is rotated and therefore, even if the substrate is large, it is not necessary for the rotating mechanism to become bulky.

Figure 4:
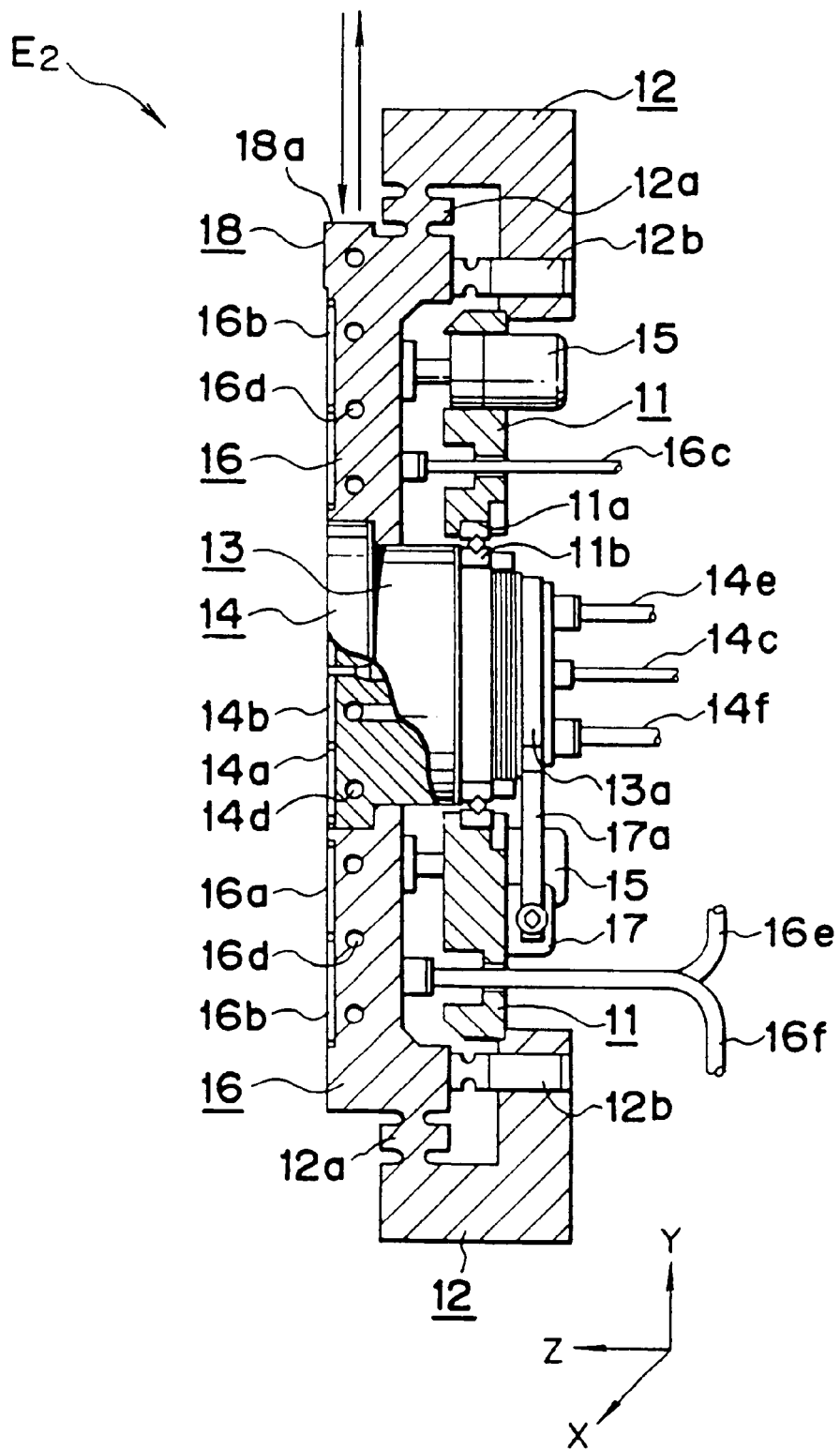
FIG. 4 is a schematic cross-sectional view showing a substrate holding device according to a second embodiment of the present invention.
Figure 5:
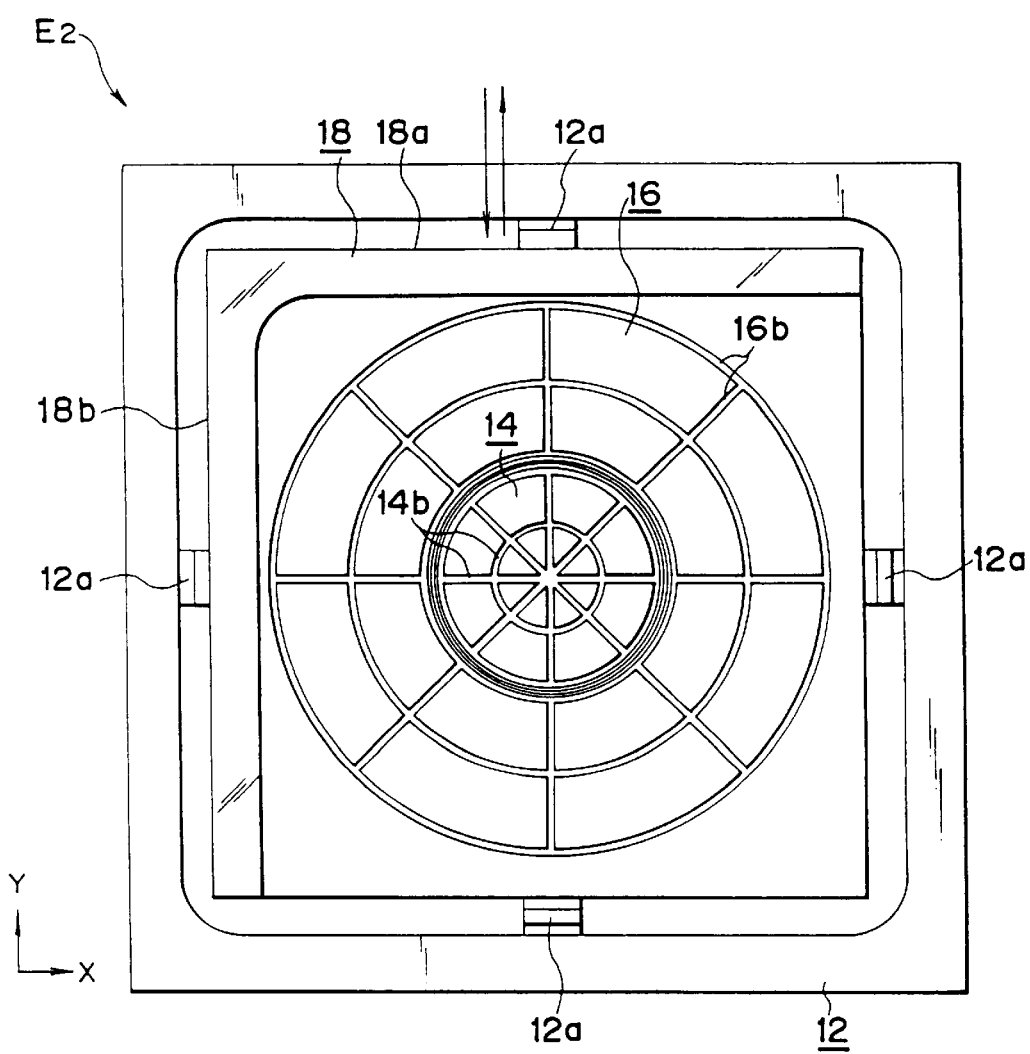
FIG. 5 is a schematic plan view of the substrate holding device according to the second embodiment.

FIG. 4 is a schematic cross-sectional view showing a second embodiment of the present invention, and FIG. 5 is a schematic plan view thereof. The substrate holding device E2 of the present embodiment has a bed plate 12 which is a substrate stage having an actuator 12b, and a second vacuum clamping plate 16 integrally coupled to the bed plate 12 through four resilient hinges 12a. An L-shaped mirror 18 having a pair of reflecting surfaces 18a and 18b orthogonal to each other is provided integrally with the outer peripheral edge of the second vacuum clamping plate 16. The bed plate 12, the second vacuum clamping plate 16 and the mirror 18 are integrally formed of a material having high rigidity and high heat conductivity and having a small coefficient of linear expansion, for example, SiC, and the reflecting surfaces 18a and 18b of the mirror 18 had Ni deposited thereon, whereafter they were subjected to Cr plating and polished into a predetermined degree of flatness. A base plate 11 which is supporting means is supported on the back of the second vacuum clamping plate 16 through a plurality of double acting cylinders 15 which are second driving means disposed at predetermined intervals circumferentially thereof, and is moved toward and away from the second vacuum clamping plate 16 by the driving of the double acting cylinders 15. A bearing lib is disposed in the central opening 11a of the base plate 11, and the bearing 11b rotatably supports a rotor 13 which is integral with a first vacuum clamping plate 14. An actuator which is first driving means for rotating the rotor 13 and the first vacuum clamping plate 14 provided integrally therewith is provided with a DC servo motor 17, and is designed to transmit the rotative drive force thereof to the lower half 13a of the rotor through a direct acting conversion mechanism, not shown, and a hinge arm 17a.

Radially and annularly extending grooves 14b and 16b are formed in the respective vacuum clamping surfaces 14a and 16a of the first and second vacuum clamping plates 14 and 16, and the grooves 14b and 16b are connected to first and second vacuum lines 14c and 16c, respectively, via internal piping, not shown.

Liquid flow paths 14d and 16d for circulating cooling, constant-temperature water are provided in the first and second vacuum clamping plates 14 and 16, respectively, and the water supply ends (not shown) thereof are connected to first and second water supply pipes 14e and 16e, respectively, and the water discharge ends (not shown) thereof are connected to first and second water discharge pipes 14f and 16f, respectively, constituting first and second water supply and discharge means together with the water supply pipes 14e and 16e. A portion of the liquid flow path 16d of the second vacuum clamping plate 16 is disposed in the mirror 18, and the second vacuum clamping plate 16 and the mirror 18 are maintained at substantially the same temperature by the circulation of the constant-temperature water. The resilient hinges 12a, the actuator 12b, the DC servo motor 17 and the mirror 18 are similar to those in the first embodiment and need not be described in detail.

The delivery of a substrate is effected as shown in FIGS. 6A to 6C.

As shown in FIG. 6A, the first vacuum clamping plate 14 is first moved in the Z axis direction by the driving of the double acting cylinders 15 and the vacuum clamping surface 14a thereof is protruded by about 6 mm from the vacuum clamping surface 16a of the second vacuum clamping plate 16, whereafter by a hand H2, a substrate W2 is conveyed to a position adjacent to the substrate holding device E2.

Then, as shown in FIG. 6B, the substrate W2 is brought close to the vacuum clamping surface 14a of the vacuum clamping plate 14, and the valve (not shown) of the first vacuum line 14c is opened to thereby adsorb the central portion of the substrate W2 to the vacuum clamping surface 14a of the first vacuum clamping plate 14. In this state, the substrate holding device E2 is moved to a prealignment station, and any positional deviation of the substrate W2 about the Z axis and any positional deviation of the substrate W2 along the X axis and Y-axis are detected by a conventional prealignment scope. The positional deviation about the Z axis is eliminated by the DC servo motor 17 being driven to rotate the first vacuum clamping plate 14 with the rotor 13, and the positional deviation along the X axis and Y axis is eliminated by controlling a six-axis driving table mechanism when the substrate holding device E2 is returned from the prealignment station to the original exposure position.

Subsequently, the first vacuum clamping plate 14 is retracted by the reverse driving of the double acting cylinders 15 to thereby bring the vacuum clamping surface 16a of the second vacuum clamping plate 16 close to the back of the outer peripheral portion of the substrate W2, as shown in FIG. 6C, and also the valve (not shown) of the second vacuum line 16c is opened to thereby adsorb the substrate W2 to the vacuum clamping surface 16a of the second vacuum clamping plate 16.

In the present embodiment, the second vacuum clamping plate 16 and the mirror 18 are provided integrally with each other and are maintained at substantially the same temperature by the circulation of the same constant-temperature water and therefore, the distances between the second vacuum clamping plate 16 and the reflecting surfaces 18a and 18b of the mirror 18 are not fluctuated by vibration or temperature variation or the like, and the measurement of position by the length measuring laser beam can be effected very accurately. In the other points, the present embodiment is similar to the first embodiment.

Figure 7:
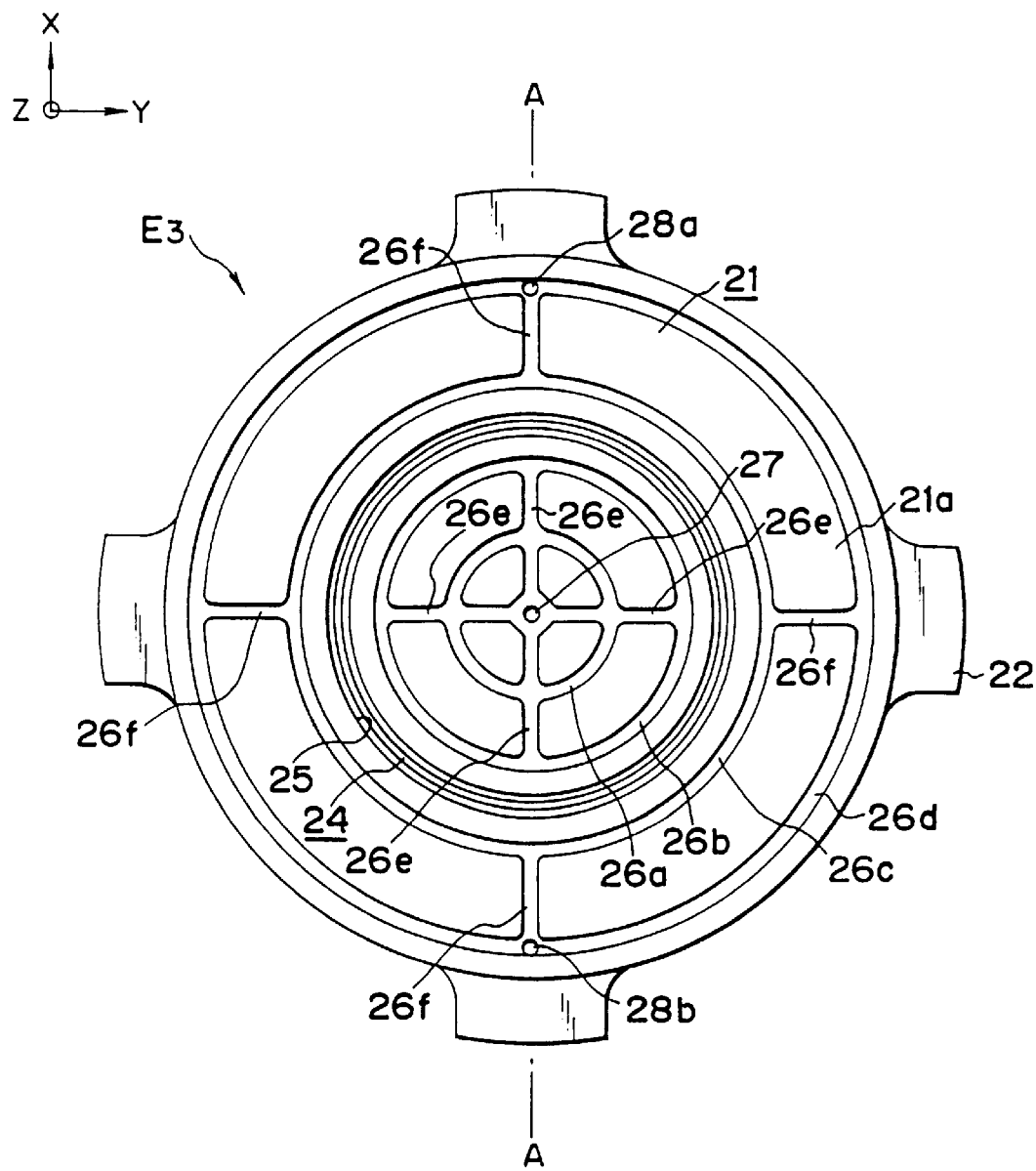
FIG. 7 is a plan view showing a substrate holding device according to a third embodiment of the present invention.
Figure 8:
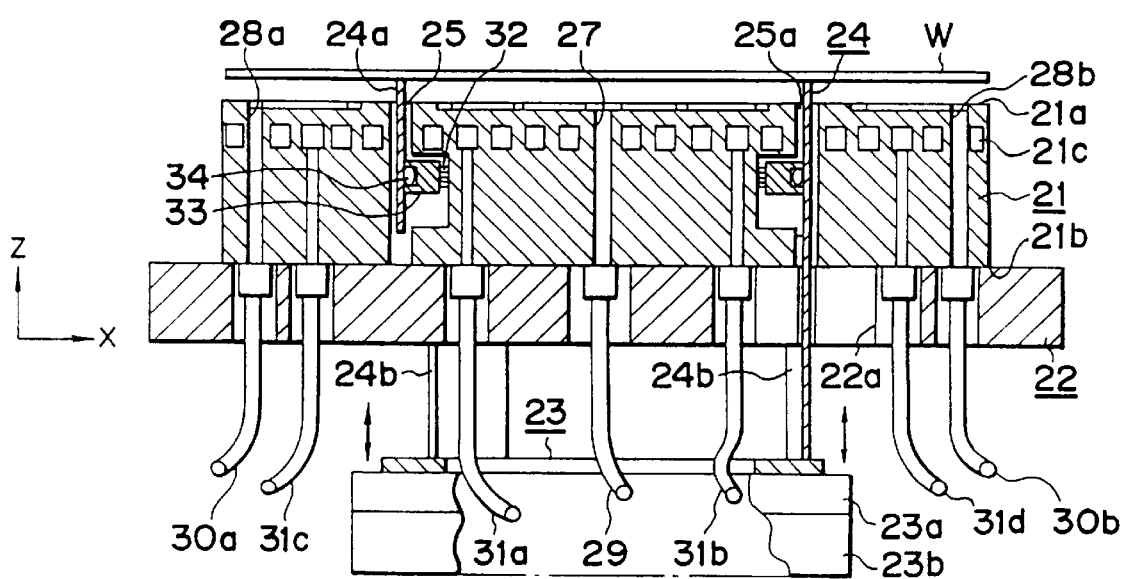
FIG. 8 is a schematic cross-sectional view of the substrate holding device according to the third embodiment.
Figure 10:
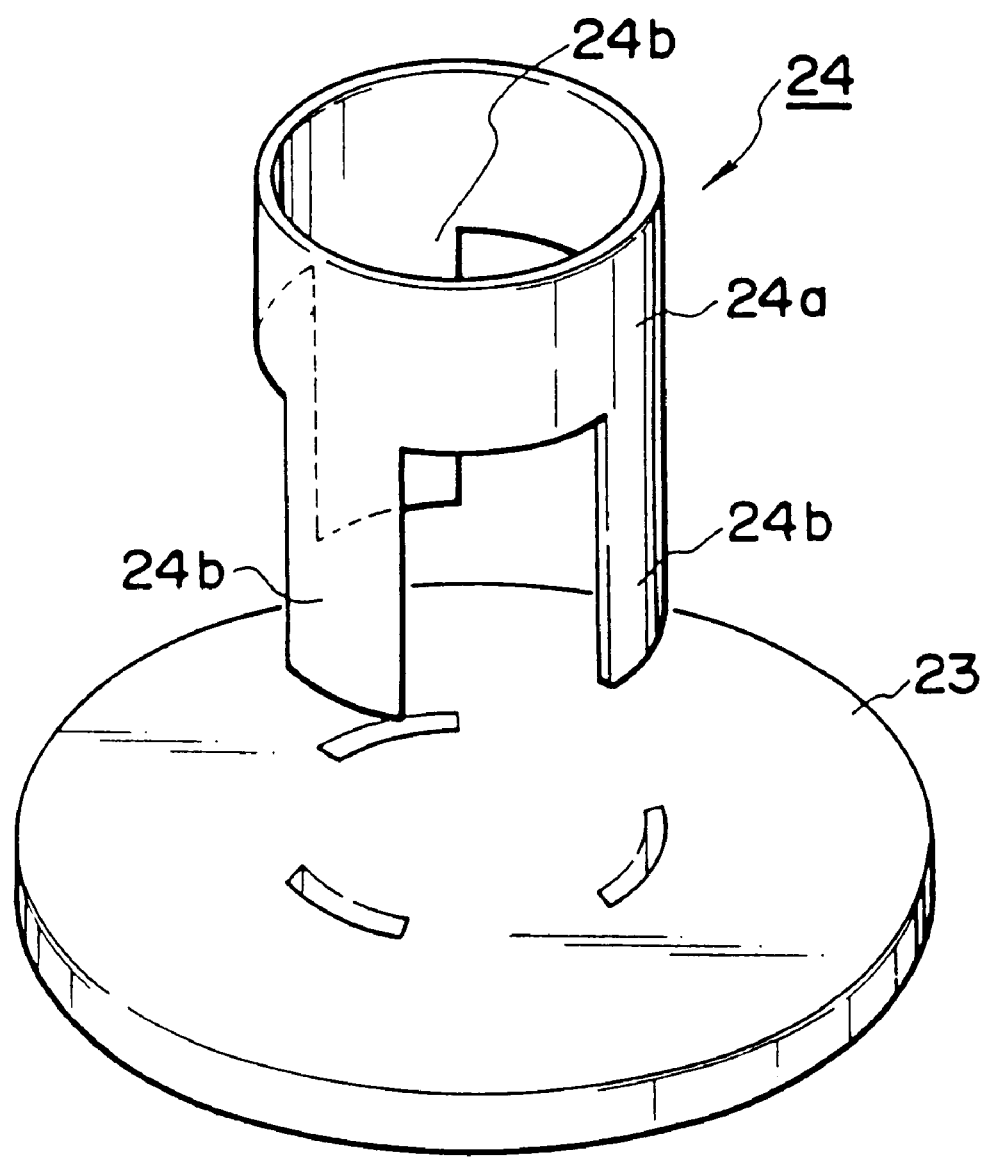
FIG. 10 is a perspective view showing only the delivery member and driving plate of the third embodiment in an exploded state.

FIG. 7 is a plan view showing a third embodiment of the present invention, and FIG. 8 is a schematic cross-sectional view thereof. The substrate holding device E3 of the present embodiment comprises a disc-like vacuum clamping plate 21 provided with a vacuum clamping surface 21a which is a holding surface for adsorbing a substrate W3 thereto, a base plate 22 coupled integrally to the back 21b of the vacuum clamping plate 21, as shown in FIG. 8, a driving plate 23 movable back and forth along an axis perpendicular to the vacuum clamping surface 21a of the vacuum clamping plate 21 (hereinafter referred to as the "Z axis") and rotatable about the Z axis, a delivering member 24 coupled integrally to the driving plate 23, a Z driving device 23a which is driving means for driving the driving plate 23 in the Z axis direction, and a θ driving device 23b for rotating the driving plate 23 about the Z axis. The delivering member 24 has a cylindrical portion 24a slidably fitted in a ring-shaped through-hole 25 formed in the vacuum clamping plate 21, and three legs 24b (see FIG. 10) integrally provided at the lower end of the cylindrical portion 24a, the legs 24b extending through an opening 22a formed in the base plate 22 and having their lower ends secured to the driving plate 23.

Four concentric annular grooves 26a–26d are formed in the vacuum clamping surface 21a of the vacuum clamping plate 21, and of these annular grooves, the pair of first annular grooves 26a and 26b located diametrically inwardly of the through-hole 25 are communicated with a first vacuum clamp hole 27 extending through the center of the vacuum clamping plate 21 by four radial straight grooves 26e, and the pair of second annular grooves 26c and 26d located diametrically outwardly of the through-hole 25 are communicated with a pair of second vacuum clamp holes 28a and 28b disposed near the outer peripheral edge of the vacuum clamping plate 21 by four radial straight grooves 26f. Also, the first vacuum clamp hole 27 is connected to a first vacuum line 29, the second vacuum clamp holes 28a and 28b are connected to second vacuum lines 30a and 30b, respectively, and the first vacuum line 29 is controllable discretely from the second vacuum lines 30a and 30b.

Further, internal piping 21c for circulating therethrough temperature controlling liquid for adjusting the temperature of the vacuum clamping surface 21a is provided within the vacuum clamping plate 21, and of the internal piping 21c, that portion which is located inside the through-hole 25 is connected to first temperature control lines 31a and 31b, and the remaining portion is connected to second temperature control lines 31c and 31d.

The space between the cylindrical portion 24a of the delivering member 24 and that side 25a of the vacuum clamping plate 21 which is diametrically inward of the through-hole 25 is hermetically sealed by an annular member 32, and a magnetic fluid seal 33 and an O-ring 34 provided on the opposite sides of the annular member 32.

Of course, the hermetic sealing means is not restricted to what has been described just above, and further, the slight gap between the cylindrical portion 24a and the side 25a of the vacuum clamping plate 21 which is diametrically inward of the through-hole 25 and between the cylindrical portion 24a and the annular member 32 may be controlled to thereby provide an equal sealing effect.

Figure 11A:
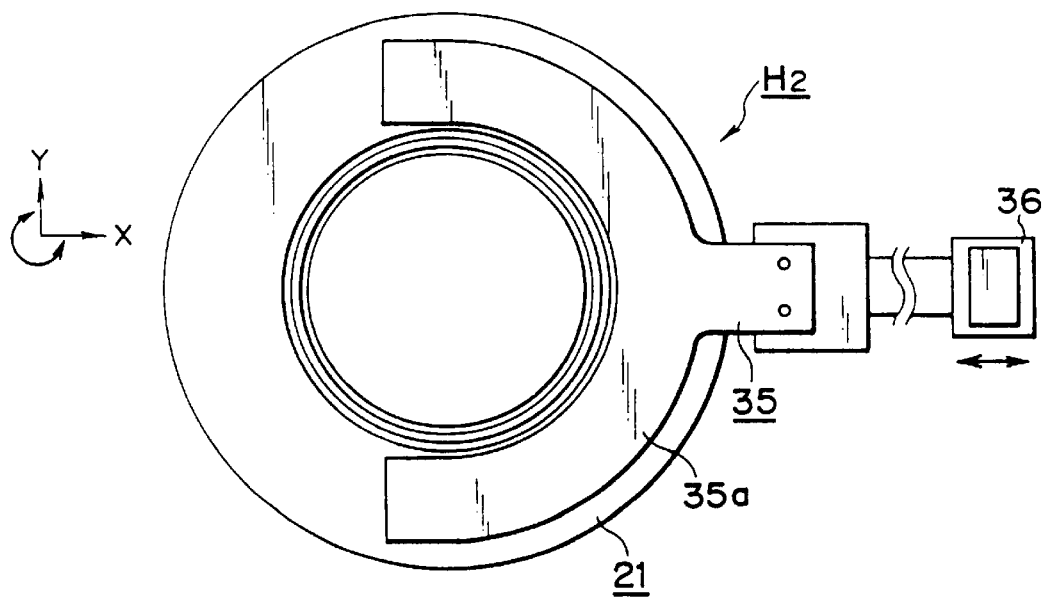
FIGS. 11A and 11B show the relation between the substrate holding device according to the third embodiment and a hand, FIG. 11A being a plan view, and FIG. 11B being an elevational view.
Figure 11B:
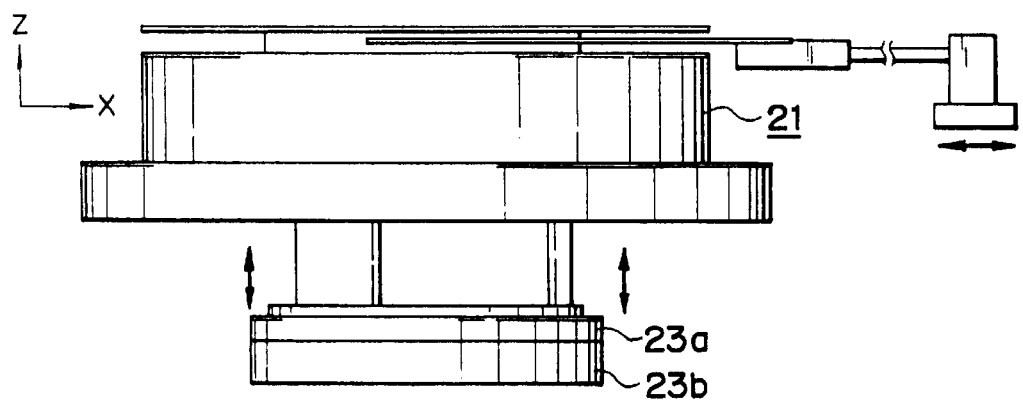

The base plate 22 is placed on a six-axis driving table, not shown, whereby the positioning in the Z axis direction and the directions of two axes orthogonal thereto (hereinafter referred to as the "X axis direction" and "Y axis direction") and the adjustment of the angles of rotation about these three axes are effected. A hand H2 which is a conveying hand for carrying a substrate W to a location proximate to the vacuum clamping surface 21a of the vacuum clamping 5 plate 21, as shown in FIGS. 11A and 11B, has a body 35 having an arcuate vacuum clamping surface 35a, and a driving device 36 for reciprocally moving the body 35 in the X axis direction, and the hand H2 adsorbs a substrate W3 to the vacuum clamping surface 35a thereof by a vacuum clamp force, and carries the substrate W3 to a predetermined location above the vacuum clamping plate 21 by moving the body 35 in the X axis direction. The delivery of the thus carried substrate is effected as follows.

Figure 9:
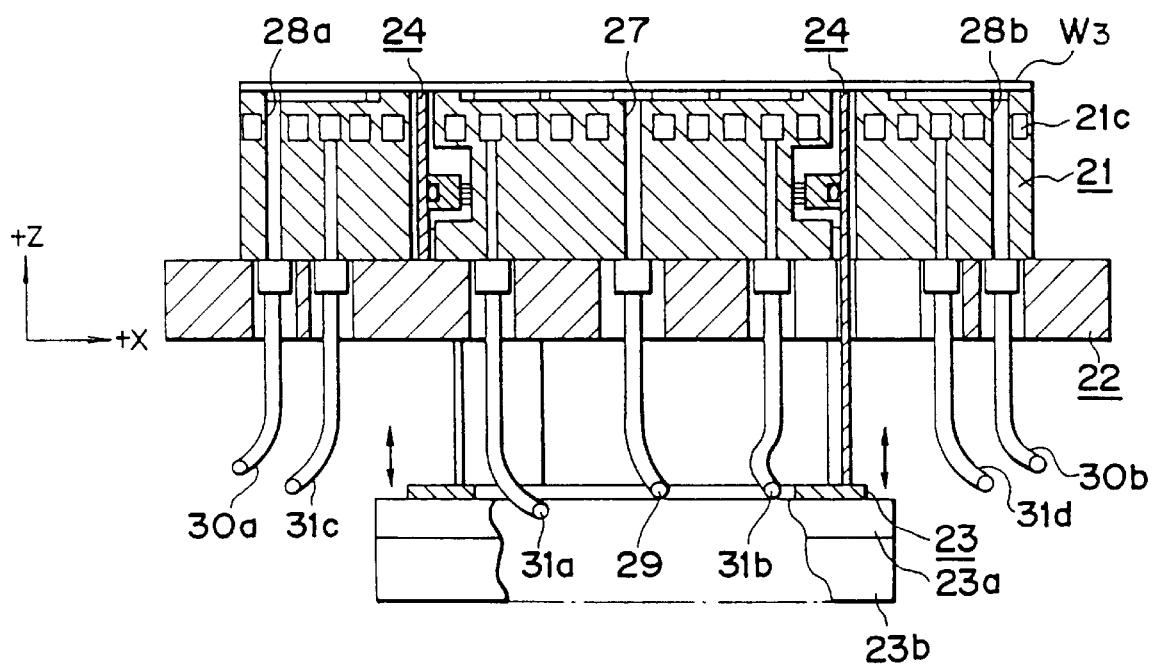
FIG. 9 is schematic cross-sectional view similar to FIG. 8 but showing a state in which the vacuum clamping plate of the third embodiment adsorbs a substrate thereto.

The Z axis driving device 23a is first driven to move the driving plate 23 forward in the Z axis direction, and the cylindrical portion 24a of the delivering member 24 is protruded by a predetermined distance from the vacuum clamping surface 21a of the vacuum clamping plate 21, and the cylindrical portion 24a is brought into contact with the substrate W3, whereafter the substrate W3 is adsorbed to the delivering member 24 by a vacuum clamp force created inside the cylindrical portion 24a of the delivering member 24 by the first vacuum line 29. The vacuum clamp force of the vacuum clamping surface 35a of the hand H2 is released, whereafter the hand H2 is retracted and if necessary, the θ driving device 23b is driven to adjust the rotated position of the substrate W3 about the Z axis, whereafter the Z axis driving device 23a is reversely driven to retract the delivering member 24 as shown in FIG. 9, and the whole surface of the substrate W3 is adsorbed to the vacuum clamping surface 21a of the vacuum clamping plate 21 by a vacuum clamp force created by the second vacuum lines 30a and 30b with the first vacuum line 29. Thereby, the substrate is firmly held and at the same time, the flatness thereof is corrected.

As described above, in the substrate holding device of the present embodiment, the substrate carried in by the hand is adsorbed to the delivering member by the vacuum clamp force created inside the cylindrical portion of the delivering member, whereby the delivery of the substrate is effected and therefore, by making the cross-sectional dimensions of the cylindrical portion of the delivering member large, the vacuum clamp force necessary for the delivery of the substrate can be made great without the area of the vacuum clamping surface of the vacuum clamping plate being decreased. Accordingly, even when the substrate is large or heavy or it is required for the delivery of the substrate to be effected with the substrate vertically held in a pressure-reduced chamber, stable delivery can be accomplished by a sufficient vacuum clamp force and moreover, there is no possibility of the correction of the flatness by the vacuum clamping plate becoming insufficient. The delivering member in the present embodiment is of a cylindrical shape, whereas this is not restrictive, but use can be made of a sleeve member of any cross-sectional shape such as a square or a polygon.

Also, in the present embodiment, a vacuum clamp is effected by a single delivering member, but for example, in order that two hollow circular delivery members may be used to make a doughnut-shaped closed space, the delivering member may be comprised of a plurality of delivering members to thereby obtain a similar effect.

Figure 12:
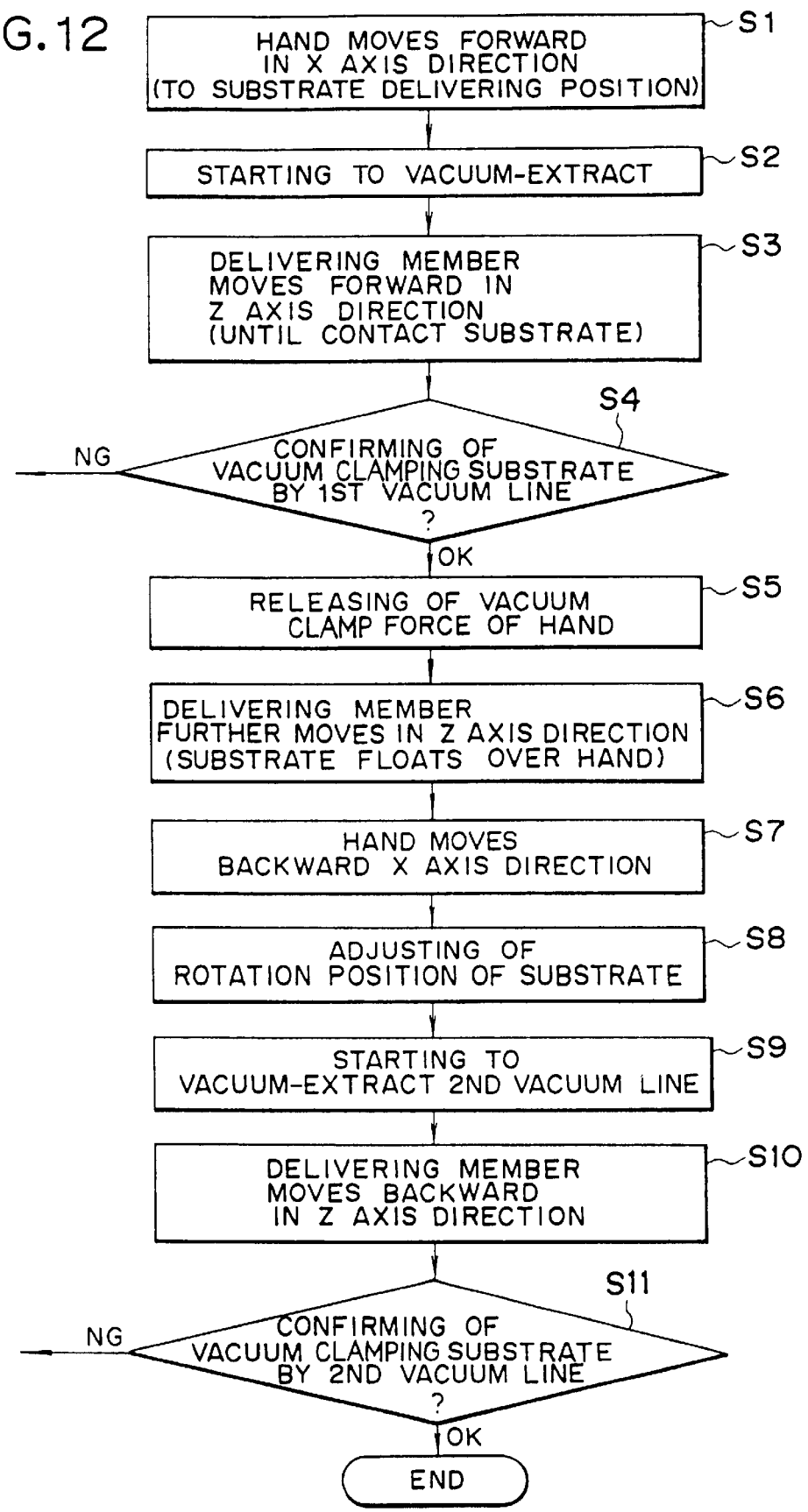
FIG. 12 is a sequence diagram showing the procedure of the delivery of a substrate in the third embodiment.

The above-described delivery work for the substrate is carried out in the procedure as shown in FIG. 12.

At a step S1, the hand moves forward in the X axis direction, whereby the substrate is carried to a predetermined position on the vacuum clamping plate, and at a step S2, the vacuum extraction of the first vacuum line is started, and at a step S3, the driving plate is driven in the Z axis direction and the delivering member moves toward the substrate, and at a step S4, it is confirmed that the delivering member has vacuum clamped the substrate, and at a step S5, the vacuum clamp force of the hand is released, and at a step S6, the delivering member further moves in the Z axis direction to thereby float the substrate from the hand, and at a step S7, the hand moves backward, and at a step S8, the driving plate is rotated about the Z axis and the rotation position of the substrate is adjusted, and at a step S9, the vacuum extraction of the second vacuum line is started, and at a step S10, the delivering member moves backward in the Z direction, and at a step S11, it is confirmed that the whole surface of the substrate has been vacuum clamped by the vacuum clamping surface of the vacuum clamping plate.

Also, when the substrate is to be separated from the vacuum clamping surface conversely to the above-described delivery, it will be better if in order to smoothly separate the substrate from the vacuum clamping plate to the delivering member, the vacuum clamping pressure of the first vacuum line is controlled by the use of a pressure sensor (not shown) and a variable conductance valve (not shown). Specifically, the vacuum clamping pressure during the vacuum clamping of the whole surface of the substrate is controlled to 100 Torr, and during the separation of the substrate, the vacuum clamping pressure is reduced to 600 Torr to thereby make smooth separation possible. Of course, irrespective of the pressure values, it will suffice if both satisfy the substrate vacuum clamping function.

Figure 13:
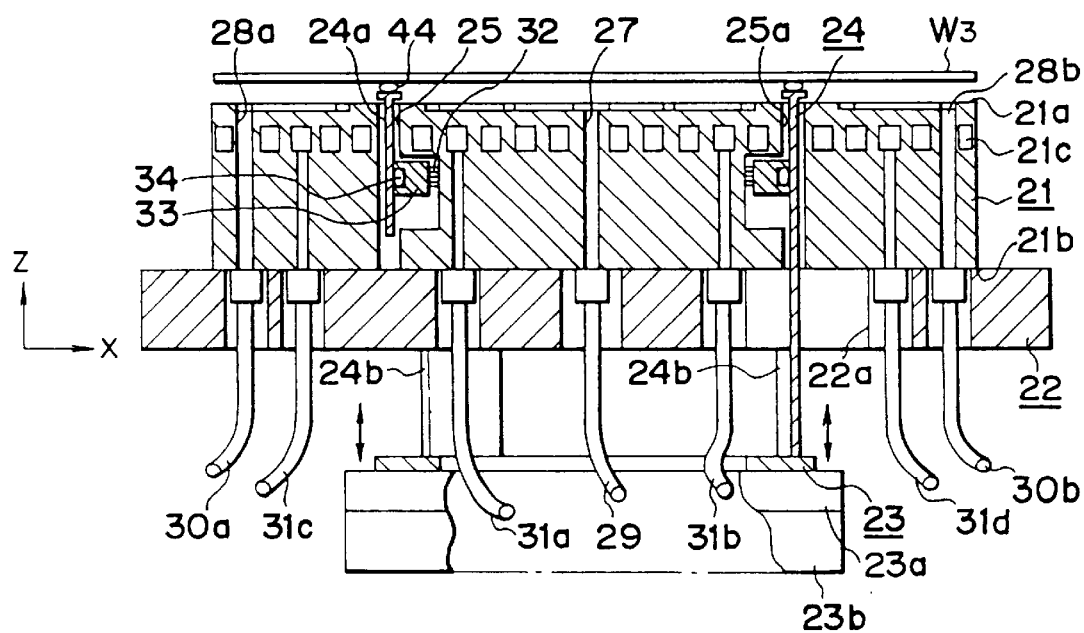
FIG. 13 is a partly cross-sectional view showing a modification of the substrate holding device according to the third embodiment.
Figure 14:
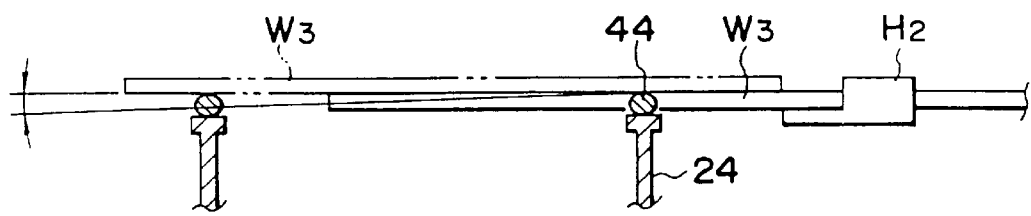
FIG. 14 illustrates a substrate delivered to the device of FIG. 13 when the substrate is inclined.

FIG. 13 shows a modification of the substrate holding device of the third embodiment, and this is such that an elastic ring 44 is adhesively secured or press-secured to that end surface of the delivering member 24 in the direction in which it protrudes so that when the substrate W3 is to be adsorbed to the delivering member 24 by the vacuum clamp force of the first vacuum line 29, the space between that end surface of the delivering member 24 in the direction in which it protrudes and the substrate W3 may be hermetically sealed. By using such an elastic ring 44, the loss of the vacuum clamp force when the delivery of the substrate W3 is effected is mitigated and in addition, even when as shown in FIG. 14, the substrate W3 carried in by the hand H2 is inclined with respect to the delivering member 24, the substrate W3 is stably held on the protruding end of the delivering member 24 and therefore, there is no possibility of great positional deviation occurring or the substrate slipping down.

Figure 15:
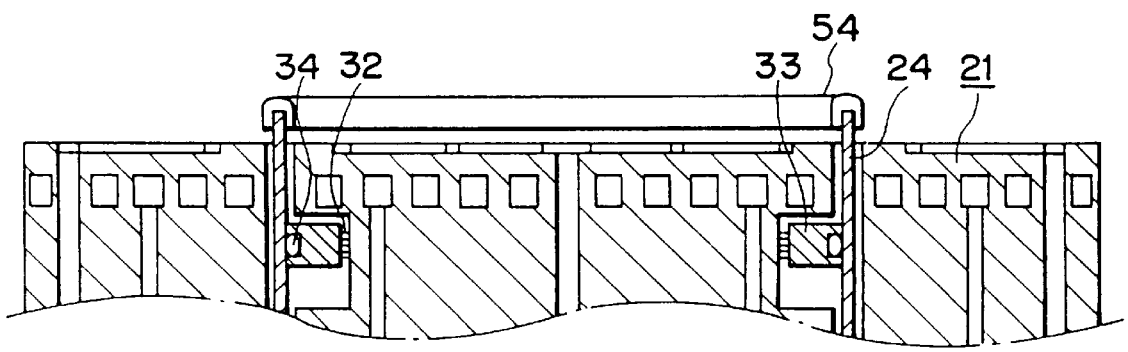
FIG. 15 is a fragmentary cross-sectional view showing another modification of the substrate holding device according to the third embodiment.
Figure 16A:
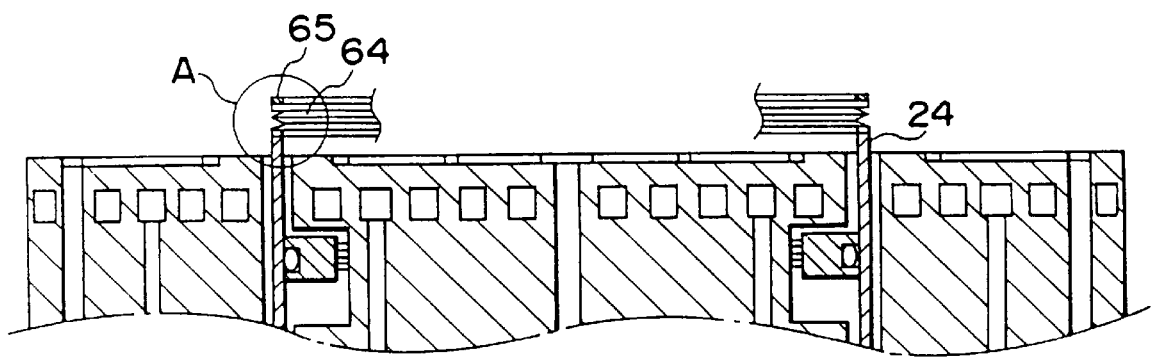
FIGS. 16A and 16B show still another modification of the substrate holding device according to the third embodiment, FIG. 16A being a fragmentary cross-sectional view thereof, and FIG. 16B enlargedly showing a portion encircled by a circle A in FIG. 16A.
Figure 16B:
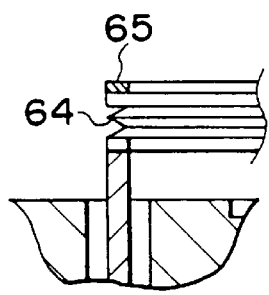

Instead of the elastic ring 44, an elastic cover 54 covering the protruding end of the delivering member 24 may be provided as shown in FIG. 15, and bellows 64 may be secured to the protruding end of the delivering member 24 as shown in FIGS. 16A and 16B, and a rubber sheet 65 may be adhered to the free end of the bellows 64.

(Embodiment of an Exposing Apparatus)

Figure 17:
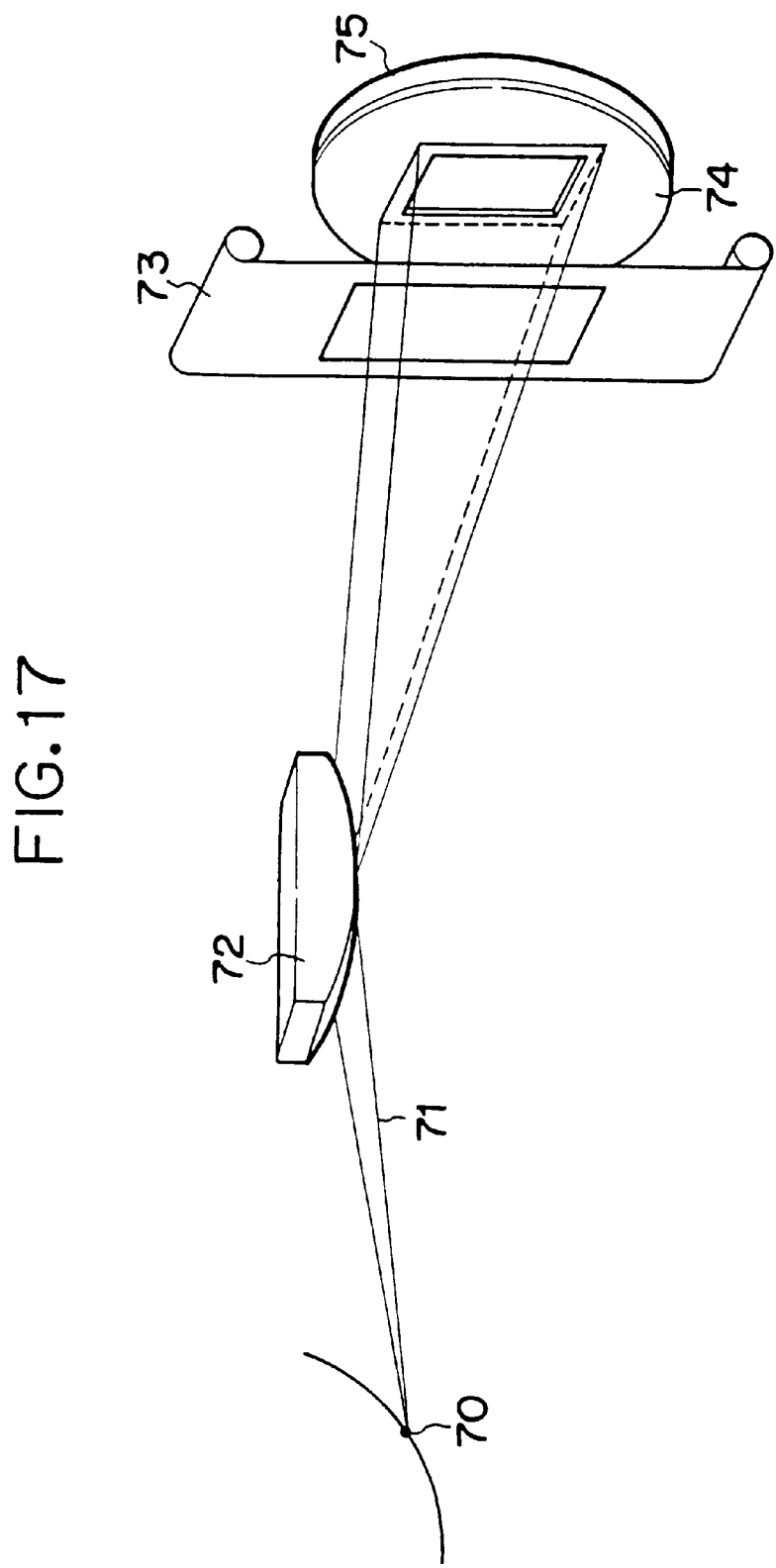
FIG. 17 illustrates an exposing apparatus according to the first to third embodiments.

A description will now be made of the exposing means of an exposing apparatus for manufacturing a minute device (such as a semiconductive device, a thin film magnetic head or a micromachine) which uses the above-described substrate holding device. FIG. 17 shows the construction of the X-ray exposing apparatus of the present embodiment. In FIG. 17, synchrotron radiation 71 in the shape of a sheet beam emitted from a light emitting point 70 for SR radiation is enlarged in a direction perpendicular to the radiation orbit plane by a convex mirror 72. The radiation reflected and enlarged by the convex mirror 72 is adjusted by a shutter 73 so that the exposure amount in the irradiated area may become uniform, and the radiation passed through the shutter 73 is directed to an X-ray mask 74. A wafer 75 which is a substrate is vertically held by the substrate holding device of the above-described construction, and an exposure pattern formed on the X-ray mask 74 is exposed on and transferred to the wafer 75 by the step and repeat system, the scanning system or the like.

(Embodiment of a Method of Manufacturing a Semiconductive Device)

Figure 18:
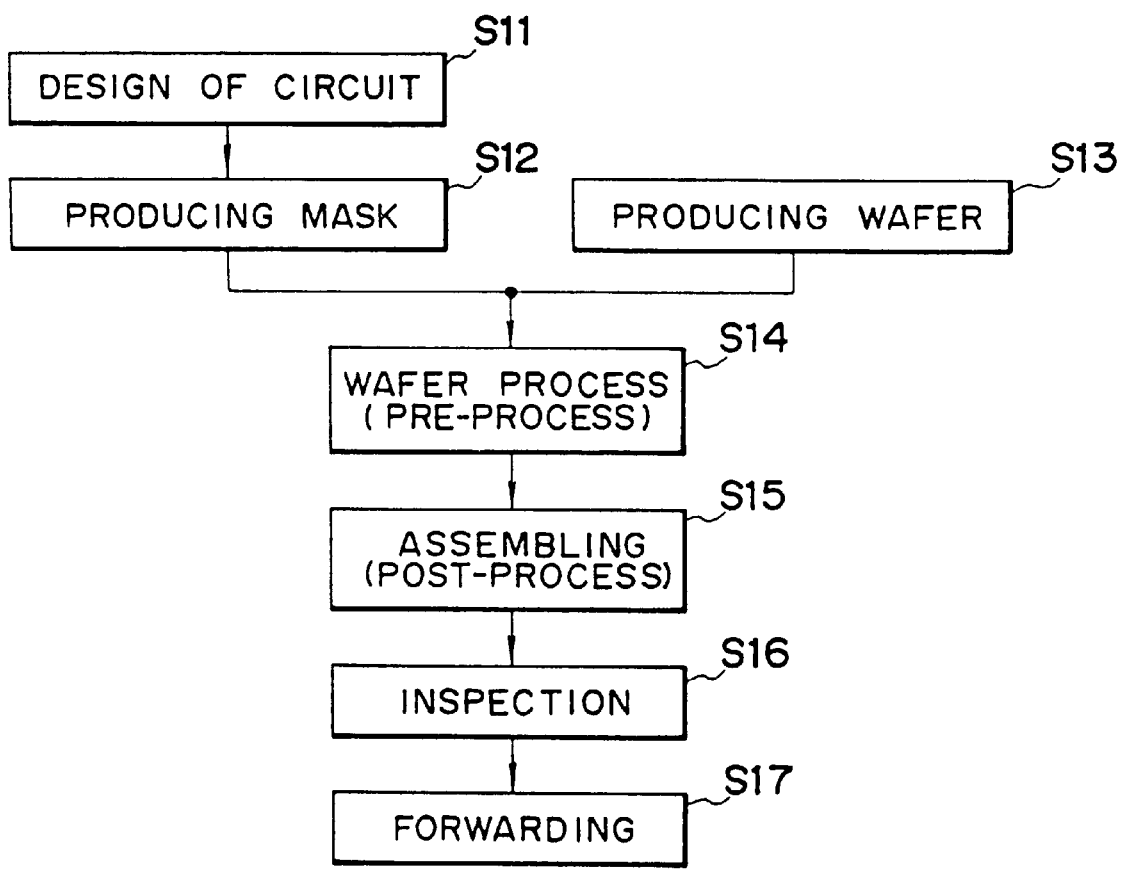
FIG. 18 is a sequence diagram illustrating an exposing method using the apparatus of FIG. 17.

A description will now be made of an embodiment of a method of manufacturing a semiconductive device which utilizes the above-described exposing apparatus. FIG. 18 shows the flow of the manufacture of a semiconductive device (a semiconductor chip such as IC or LSI, a liquid crystal panel, a CCD, a thin film magnetic head, a micromachine or the like). At a step S11 (the design of a circuit), the design of the circuit of a semiconductive device is effected. At a step S12 (the production of a mask), a mask formed with the designed circuit pattern is produced. On the other hand, at a step S13 (the production of a wafer), a wafer which is a substrate is produced by the use of a material such as silicon. A step S14 (wafer process) is called a pre-process, in which by the use of the above-mentioned prepared mask and wafer, an actual circuit is formed on the wafer by the lithography technique. The next step S15 (assembling) is called a post-process which is a process for making a semiconductor chip by the use of the wafer produced at the step S14, and it includes steps such as the assembling step (dicing and bonding) and the packaging step (enveloping the chip). At a step S16 (inspection), inspections such as an operation confirmation test and a durability test of the semiconductive device produced at the step S15 are effected. By way of such steps, the semiconductive device is completed and is forwarded (step S17).

Figure 19:
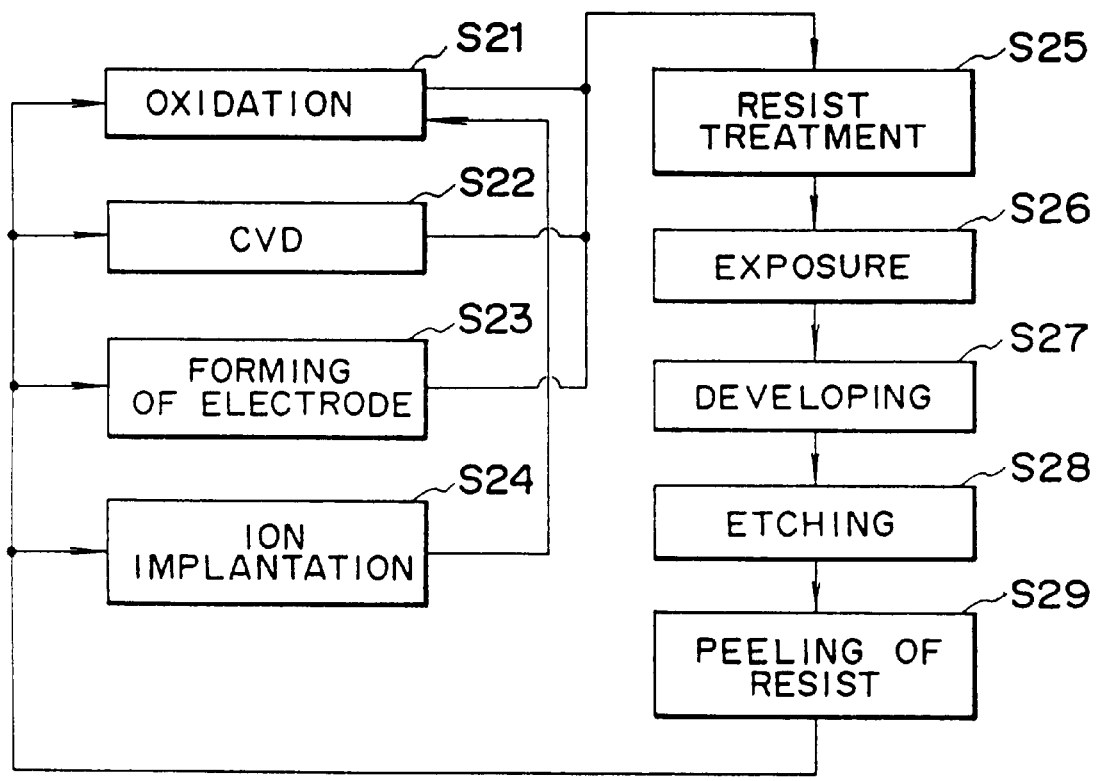
FIG. 19 is a sequence diagram showing the detailed flow of a wafer process.
Figure 20:
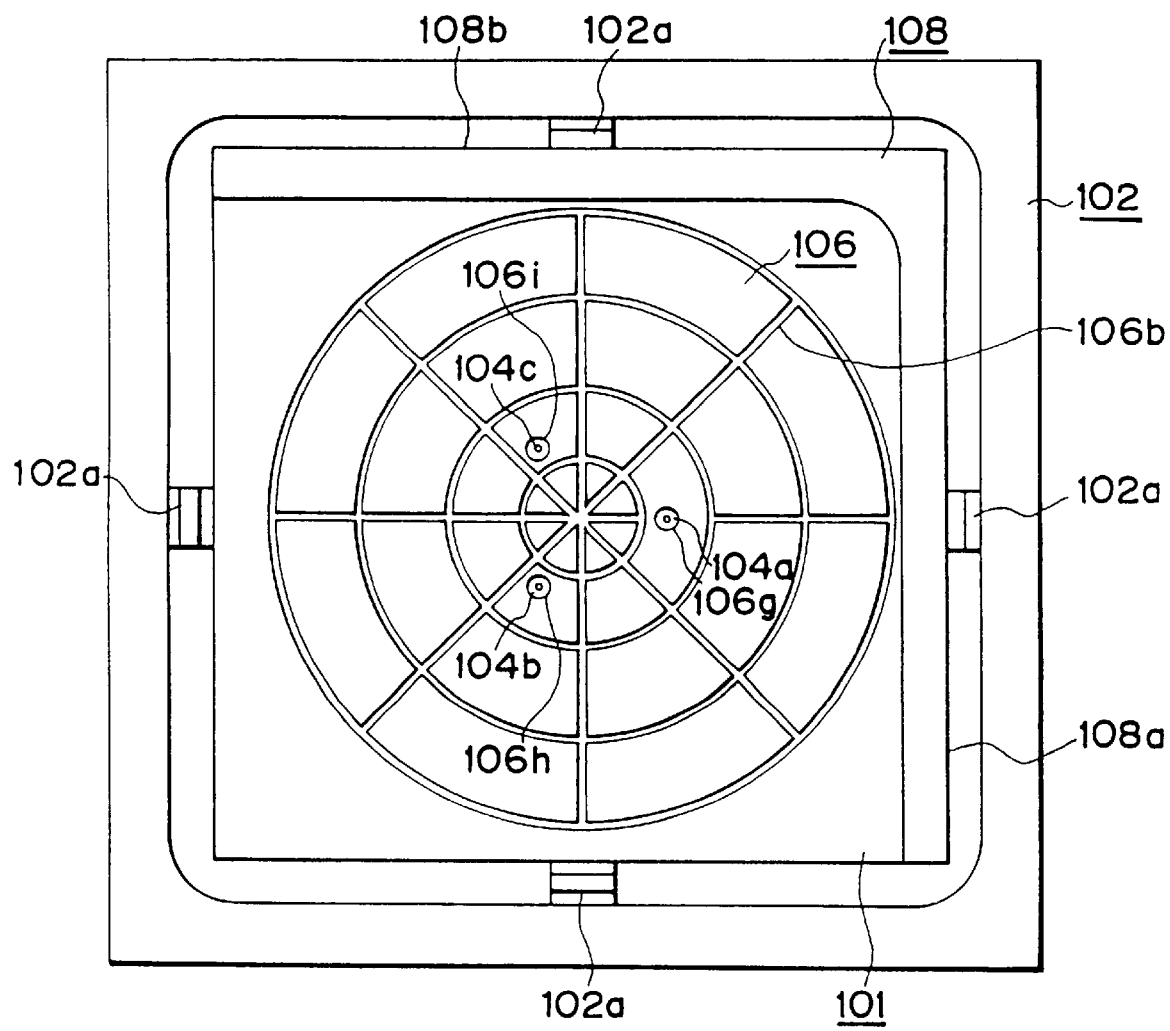
FIG. 20 is a schematic plan view showing a substrate holding device according to the prior art.
Figure 21:
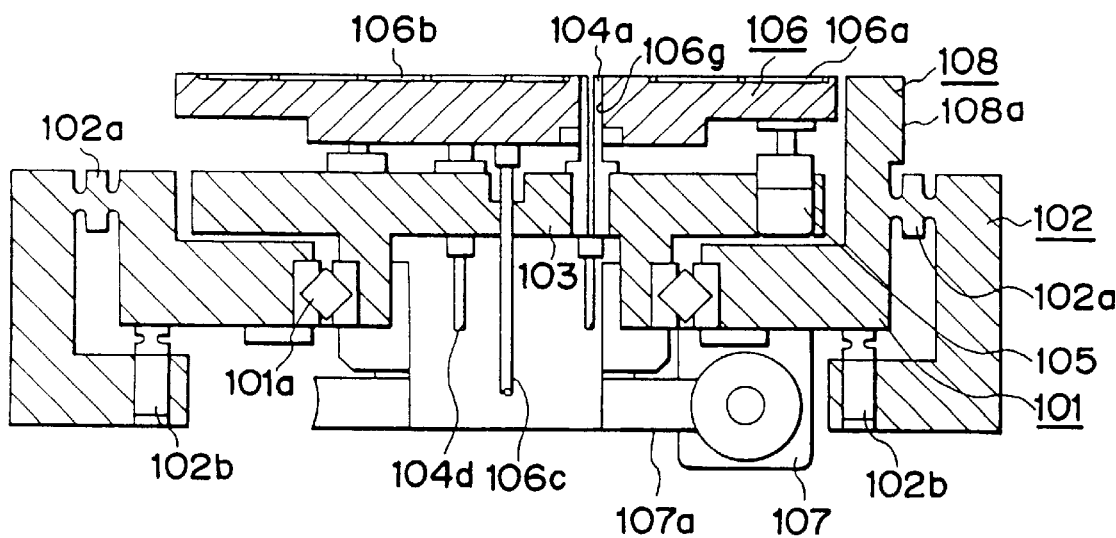
FIG. 21 is a schematic cross-sectional view of the device shown in FIG. 20.

FIG. 19 shows the detailed flow of the above-described wafer process. At a step S21 (oxidation), the surface of the wafer is oxidized. At a step S22 (CVD), an insulating film is formed on the surface of the wafer. At a step S23 (forming of an electrode), an electrode is formed on the wafer by deposition. At a step S24 (ion implantation), ions are implanted into the wafer. At a step S25 (resist treatment), a photoresist is applied to the wafer. At a step S26 (exposure), the circuit pattern of the mask is printed and exposed on the wafer by the above-described exposing apparatus. At a step S27 (developing), the exposed wafer is developed. At a step S28 (etching), the portion of the wafer other than the developed resist layer is scraped off. At a step S29 (peeling of resist), the resist which has become unnecessary after the etching is finished is removed. By these steps being repetitively executed, a circuit pattern is formed on the wafer in a multiplex fashion. If the manufacturing method of the present embodiment is used, there can be manufactured a semiconductive device of a high degree of integration which has heretofore been difficult to manufacture.

What is claimed is:
1. A substrate holding device comprising:
 a holding surface for holding a substrate;
 a hollow member surrounding at least a portion of said holding surface and movable between a position in which said hollow member protrudes from said holding surface and a position in which said hollow member does not protrude from said holding surface;
 vacuum supplying means for supplying a vacuum inside said hollow member; and
 moving means for providing relative movement between said hollow member and said holding surface.
2. A substrate holding device according to claim 1, further comprising exposing means for effecting exposure on a substrate held on the holding surface.
3. A substrate holding device according to claim 1, further comprising means for controlling a vacuum clamp force provided in a portion of the holding surface and a vacuum clamp force provided in the remaining portion of the holding surface discretely from each other.
4. A substrate holding device according to claim 1, further comprising a mechanism for rotating said hollow member.
5. A substrate holding device according to claim 1, wherein an elastic member is provided on an end surface of said hollow member in a direction in which said hollow member protrudes.

6. A substrate holding device comprising:

first holding means having a first holding surface for holding a substrate;

second holding means having a second holding surface for holding the substrate; and moving means for moving the first holding surface of said first holding means relative to the second holding surface of said second holding means in a predetermined direction, wherein both said first holding means and said second holding means hold the substrate after said moving means moves the first holding surface holding the substrate relative to the second holding surface.

7. A device according to claim 6, wherein the predetermined direction comprises a direction perpendicular to the first holding surface.

8. A device according to claim 6, wherein the predetermined direction comprises a direction parallel to the first holding surface.

9. A device according to claim 8, wherein the predetermined direction comprises a rotational direction in a surface parallel to the first holding surface.

10. A device according to claim 6, further comprising exposing means for exposing the substrate held by said holding device with radiation.

11. A device according to claim 10, further comprising a liquid flow path for circulating temperature adjusting liquid.

12. A device according to claim 11, further comprising means for independently controlling the flow of liquid through said first holding means and said second holding means, on the basis of the exposure performed by said exposing means.

13. A device according to claim 6, further comprising a mirror for reflecting a light beam for measuring positional information regarding said second holding means.

14. A method of handling a substrate, said method comprising:

providing relative movement between a first holding surface of first holding means and a second holding surface of second holding means so that the first holding surface protrudes from the second holding surface;

holding a substrate by the first holding surface;

moving the first holding surface relative to the second holding surface in a direction parallel to the first holding surface;

providing relative movement between the first holding surface and the second holding means in a direction perpendicular to the first holding surface so that the first holding surface does not protrude from the second holding surface; and holding a substrate by the second holding surface.

15. A method according to claim 14, further comprising exposing the held substrate with radiation.

16. A method according to claim 15, further comprising independently controlling flow of a temperature adjusting liquid through the first holding means and the second holding means, on the basis of the exposure in said exposing step.

* * * * *

UNITED STATES PATENT AND TRADEMARK OFFICE
CERTIFICATE OF CORRECTION

PATENT NO. : 5,999,589
DATED : December 7, 1999
INVENTOR(S) : Yuji Chiba et al.

It is certified that error appears in the above-identified patent and that said Letters Patent is hereby corrected as shown below:

Column 2,
Line 60, "IIowever," should read -- However --.

Column 7,
Line 39, "lib" should read -- 11b --.

Signed and Sealed this

Twenty-third Day of November, 2004

JON W. DUDAS
*Director of the United States Patent and Trademark Office*